United States Patent
Jeon et al.

(10) Patent No.: US 9,825,182 B2
(45) Date of Patent: Nov. 21, 2017

(54) METHOD OF INTERCALATING INSULATING LAYER BETWEEN METAL AND GRAPHENE LAYER AND METHOD OF FABRICATING SEMICONDUCTOR DEVICE USING THE INTERCALATION METHOD

(71) Applicant: Samsung Electronics Co., Ltd., Suwon-si, Gyeonggi-do (KR)

(72) Inventors: Insu Jeon, Seoul (KR); Jiyeon Ku, Suwon-si (KR); Hyowon Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/051,270

(22) Filed: Feb. 23, 2016

(65) Prior Publication Data

US 2016/0247942 A1 Aug. 25, 2016

(30) Foreign Application Priority Data

Feb. 24, 2015 (KR) .................. 10-2015-0025908

(51) Int. Cl.
*H01L 21/00* (2006.01)
*H01L 29/786* (2006.01)
(Continued)

(52) U.S. Cl.
CPC .. *H01L 29/78696* (2013.01); *H01L 21/02425* (2013.01); *H01L 21/02488* (2013.01);
(Continued)

(58) Field of Classification Search
CPC ......... H01L 29/78696; H01L 21/02425; H01L 21/02488
See application file for complete search history.

(56) References Cited

U.S. PATENT DOCUMENTS 8,629,427 B2 1/2014 Banerjee et al.
2010/0127312 A1 5/2010 Grebel et al.
(Continued)

FOREIGN PATENT DOCUMENTS

KR 20110006644 A 1/2011
KR 20120087486 A 8/2012
(Continued)

OTHER PUBLICATIONS

Lei Meng et al., "Silicon intercalation at the interface of graphene and Ir(111)," Institute of Physics, Chinese Academy of Sciences, Jan. 8, 2012, Applied Physics Letters 100, 083101 1-4.
(Continued)

*Primary Examiner* — Laura Menz
(74) *Attorney, Agent, or Firm* — Harness, Dickey & Pierce P.L.C.

(57) ABSTRACT

A method includes growing a graphene layer on a metal layer, intercalating a first material between the metal layer and the graphene layer by heating the first material at a first pressure and a first temperature, and intercalating a second material between the metal layer and the graphene layer by heating the second material at a second pressure different from the first pressure and a second temperature different from the first temperature. Accordingly, the first material and the second material are chemically bonded to each other to form an insulating layer, and the insulating layer may be between the metal layer and the graphene layer.

16 Claims, 9 Drawing Sheets

(51) Int. Cl.
H01L 29/16 (2006.01)
H01L 29/66 (2006.01)
H01L 21/04 (2006.01)
H01L 21/02 (2006.01)

(52) U.S. Cl.
CPC .. *H01L 21/02499* (2013.01); *H01L 21/02527* (2013.01); *H01L 21/02664* (2013.01); *H01L 21/044* (2013.01); *H01L 29/1606* (2013.01); *H01L 29/66045* (2013.01)

(56) References Cited

U.S. PATENT DOCUMENTS

| | | | |
|---|---|---|---|
| 2011/0086756 A1* | 4/2011 | Gao | B82Y 30/00 502/182 |
| 2012/0161098 A1 | 6/2012 | Hiura et al. | |
| 2012/0247545 A1 | 10/2012 | Aria et al. | |
| 2012/0288433 A1* | 11/2012 | Sutter | B82Y 30/00 423/445 B |
| 2012/0321545 A1* | 12/2012 | Jeon | B82Y 40/00 423/448 |
| 2013/0171502 A1* | 7/2013 | Chen | H01G 11/06 429/149 |
| 2013/0280829 A1 | 10/2013 | Grebel et al. | |
| 2014/0158989 A1 | 6/2014 | Byun et al. | |
| 2015/0060869 A1* | 3/2015 | Ro | H01L 27/1266 257/72 |
| 2015/0060870 A1* | 3/2015 | Ro | H01L 27/1218 257/72 |
| 2015/0144882 A1 | 5/2015 | Kelber | |
| 2016/0247942 A1* | 8/2016 | Jeon | H01L 21/02425 |

FOREIGN PATENT DOCUMENTS

| | | |
|---|---|---|
| KR | 20140003218 A | 1/2014 |
| WO | WO-2014/008453 A2 | 1/2014 |

OTHER PUBLICATIONS

Rosanna Larciprete et al., "Oxygen Switching of the Epitaxial Graphene-Metal Interaction," CNR-Institute for Complex Systems, Oct. 10, 2012, ACSNANO, vol. 6, No. 11, pp. 9551-9558.

Jinhai Mao et al., "Silicon layer intercalation of centimeter-scale, epitaxially grown monolayer graphene on Ru(0001)," Institute of Physics, Chinese Academy of Sciences, Feb. 27, 2012, Applied Physics Letters 100, 093101 1-4.

Peter Sutter et al., "Chemistry under Cover: Tuning Metal—Graphene Interaction by Reactive Intercalation," Center for Functional Nanomaterials, May 19, 2010, JACS Articles, J. Am. Chem. Soc., 132, 8175-8179.

Joshua D. Caldwell et al., "Technique for the Dry Transfer of Epitaxial Graphene onto Arbitrary Substrates," U.S. Naval Research Laboratory, Electrical Engineering Department, University of Maryland, pp. 1-8.

Matthew J. Allen et al., "Soft Transfer Printing of Chemically Converted Graphene," Advanced Materials 2009, vol. 21, pp. 2098-2102.

Da Zhan et al., "FeCl3 based Few-Layer Graphene Intercalation Compounds: Single Linear Dispersion Electronic Band Structure and Strong Charge Transfer Doping," Department of Physics, Southeast University; School of Materials Science and Engineering, Nanyang Technological University; Institute of Advances Materials, Nanjing University of Posts and Telecommunications, pp. 1-19.

Myriano H. Oliveira Jr et al., "Formation of high-quality quasi-free-standing bilayer graphene on SiC(0001) by oxygen intercalation upon annealing in air," Paul-Drude-Institut fuer Festkoerperelektronik, Lehrstruhl fuer Technische Physik, 2013, Carbon 52, pp. 83-89.

Jinhao Mao et al., Silicon Layer Intercalation of Centimeter-Scale, Epitaxially-Grown Monolayer Graphene on Ru(0001), Institute of Physics, Chinese Academy of Sciences,117542, pp. 1-13.

Extended European Search Report dated Jun. 27, 2016 issued in corresponding European Patent Application No. 16157047.8.

* cited by examiner

FIG. 7

METHOD OF INTERCALATING INSULATING LAYER BETWEEN METAL AND GRAPHENE LAYER AND METHOD OF FABRICATING SEMICONDUCTOR DEVICE USING THE INTERCALATION METHOD

CROSS-REFERENCE TO RELATED APPLICATION

This application claims the benefit of Korean Patent Application No. 10-2015-0025908, filed on Feb. 24, 2015, in the Korean Intellectual Property Office, the disclosure of which is incorporated herein in its entirety by reference.

BACKGROUND

1. Field

Example embodiments relate to methods of intercalating an insulating layer between a metal and a graphene layer, and more particularly, to methods of intercalating an insulating layer between a metal and a graphene layer that is directly grown on the metal.

2. Description of the Related Art

Graphene is a material having a single-atom-thick two-dimensional (2D) planar sheet made of carbon atoms. Since graphene has stable and desirable electrical/mechanical/chemical properties and has desirable conductivity, graphene has been spotlighted as a next-generation material. In particular, a study of a method of manufacturing an electronic device by using graphene, instead of a silicon semiconductor, has been conducted. For example, a transistor that uses graphene as a channel layer by combining graphene with another 2D material or combining graphene with a typical semiconductor material has been developed.

In general, graphene may be directly grown on a surface of a metal by using chemical vapor deposition (CVD). Accordingly, in order to use graphene in a semiconductor device or a display apparatus, transferring graphene that is grown on a metal substrate onto a surface of another material, e.g., a nonconductor may be necessary. Examples of a general method of transferring graphene include a method of moving graphene that remains after a metal substrate is dissolved in a liquid solvent to a surface of another material and a method of detaching graphene from a metal substrate by using a stamp having an adhesive force and attaching the graphene adhered to the stamp to a surface of another material.

SUMMARY

Example embodiments provide methods of intercalating an insulating layer between a metal and a graphene layer that is directly grown on the metal.

Example embodiments provide methods of fabricating a semiconductor device by using the intercalation methods.

Additional aspects will be set forth in part in the description which follows and, in part, will be apparent from the description, or may be learned by practice of the example embodiments.

According to example embodiments, a method includes growing a graphene layer on a metal layer, depositing a first material on a surface of the graphene layer, intercalating the first material between the graphene layer and the metal layer by heating the first material at a first pressure and a first temperature, depositing a second material over the surface of the graphene layer, and intercalating the second material between the graphene layer and the metal layer by heating the second material at a second pressure different from the first pressure and a second temperature different from the first temperature to form a first insulating layer between the metal layer and the graphene layer, the first material and the second material being chemically bonded to each other.

The first material may include at least one of silicon (Si), aluminum (Al), hafnium (Hf), zirconium (Zr), and lanthanum (La).

The second material may include at least one of oxygen (O) and nitrogen (N), and the first insulating layer may include one of an oxide insulator and a nitride insulator.

The insulating layer may include one of oxide insulator crystals and nitride insulator crystals.

The first pressure may be lower than the second pressure and the first temperature may be higher than the second temperature.

The first pressure may be equal to or lower than $10^{-9}$ torr and the first temperature may range from about 500° C. to about 550° C., and the second pressure may range from $2\times10^{-7}$ torr to $8\times10^{-7}$ torr and the second temperature may range from about 340° C. to about 400° C.

Intercalating the first material and intercalating the second material may be sequentially and repeatedly performed.

Intercalating the second material may be continuously and repeatedly performed at least twice after continuously and repeatedly intercalating the first material at least twice.

After intercalating the first material, the method may further include depositing a third material on the surface of the graphene layer, the third material being different from the first material and the second material, intercalating the third material between the graphene layer and the metal layer by heating the third material at the first pressure and the first temperature prior to intercalating the second material, and forming a second insulating layer between the metal layer and the graphene layer after intercalating the second material, the third material and the second material being chemically bonded to each other.

The third material may include at least one of Si, Al, Hf, Zr, and La.

After intercalating the second material, the method may further include depositing a third material, on the surface of the graphene layer, the third material being different from the first material and the second material, and intercalating the third material between the graphene layer and the metal layer by heating the third material at the first pressure and the first temperature to form a second insulating layer between the metal layer and the graphene layer, the third material and the second material being chemically bonded to each other.

The method may further include patterning the graphene layer after growing the metal layer.

For example, the metal layer may include at least one of copper (Cu), nickel (Ni), platinum (Pt), cobalt (Co), ruthenium (Ru), aluminum (Al), iron (Fe), gold (Au), magnesium (Mg), chromium (Cr), manganese (Mn), rhodium (Rh), tantalum (Ta), titanium (Ti), iridium (Ir), uranium (U), vanadium (V), and tungsten (W).

According to example embodiments, a method of fabricating a transistor includes growing a graphene layer on a metal layer, patterning the graphene layer, depositing a first material on a surface of the graphene layer, intercalating the first material between the graphene layer and the metal layer by heating the first material at a first pressure and a first temperature, depositing a second material over the surface of the graphene layer, intercalating the second material between the graphene layer and the metal layer by heating the second material at a second pressure different from the first pressure and a second temperature different from the first temperature to form an insulating layer between the metal layer and the graphene layer, the first material and the second material being chemically bonded to each other, and forming a first electrode contacting one side of the graphene layer and a second electrode contacting another side of the graphene layer.

According to example embodiments, a stacked structure includes a crystalline insulating layer on a metal layer, the crystalline insulating layer including a first material and a second material different from the first material, the first material and the second material being chemically bonded to each other, the second material including at least one of oxygen (O) and nitrogen (N), and a graphene layer on the insulating layer.

The stacked structure may further include a compound layer between the metal layer and the insulating layer, the compound layer including a reaction product of the first material and a metal of the metal layer.

The first material may include at least one of silicon (Si), aluminum (Al), hafnium (Hf), zirconium (Zr), and lanthanum (La).

The metal layer may include at least one of copper (Cu), nickel (Ni), platinum (Pt), cobalt (Co), ruthenium (Ru), aluminum (Al), iron (Fe), gold (Au), magnesium (Mg), chromium (Cr), manganese (Mn), rhodium (Rh), tantalum (Ta), titanium (Ti), iridium (Ir), uranium (U), vanadium (V), and tungsten (W).

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Example embodiments will now be described more fully with reference to the accompanying drawings, in which example embodiments of the inventive concepts are shown. In the drawings, the same reference numerals denote the same elements and the sizes of components may be exaggerated for clarity. The inventive concepts may have different forms and should not be construed as limited to the example embodiments set forth herein. For example, it will also be understood that when a layer is referred to as being "on" another layer, it can be directly on the other layer, or intervening layers may also be present therebetween. As used herein, the term "and/or" includes any and all combinations of one or more of the associated listed items. Expressions such as "at least one of," when preceding a list of elements, modify the entire list of elements and do not modify the individual elements of the list.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises", "includes", "including" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As described above, a graphene layer may be grown on a surface of a metal substrate by using chemical vapor deposition (CVD). Carbon atoms in the grown graphene layer are strongly $sp^2$ bonded to one another, whereas the graphene layer and the metal substrate are relatively weakly bonded to each other by only a van der Waals force. Accordingly, it is possible to insert a material between the graphene layer and the metal substrate under an appropriate condition. A method of additionally inserting another material between the graphene layer and the metal substrate is referred to as an intercalation method. Currently, findings of an intercalation method performed on various materials have been reported. However, an intercalation method is largely used in order to reduce the effect of the metal substrate on the graphene layer and to enable the graphene layer to behave like a freestanding one.

FIGS. 1A through 1F are cross-sectional views for explaining a process of intercalating an insulating layer between a metal substrate 100 and a graphene layer 101 by using an intercalation method, according to example embodiments.

Figure 1A:
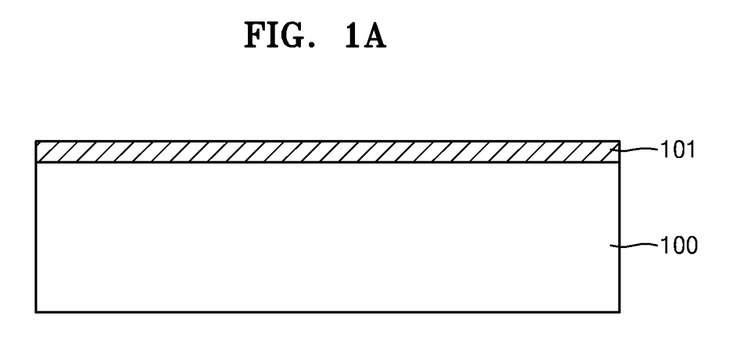
FIGS. 1A through 1F are cross-sectional views for explaining a process of intercalating an insulating layer between a metal substrate and a graphene layer, according to example embodiments.

Referring to FIG. 1A, the graphene layer 101 is grown on the metal substrate 100. As described above, the graphene layer 101 may be grown by using CVD. The metal substrate 100 may include at least one metal from among, for example, copper (Cu), nickel (Ni), platinum (Pt), cobalt (Co), ruthenium (Ru), aluminum (Al), iron (Fe), gold (Au), magnesium (Mg), chromium (Cr), manganese (Mn), rhodium (Rh), tantalum (Ta), titanium (Ti), iridium (Ir), uranium (U), vanadium (V), and tungsten (W), or an alloy thereof. Also, in order to more easily grow the graphene layer 101 having a hexagonal structure, the metal substrate 100 may have, for example, a (111) or (0001) crystalline orientation.

Figure 1B:
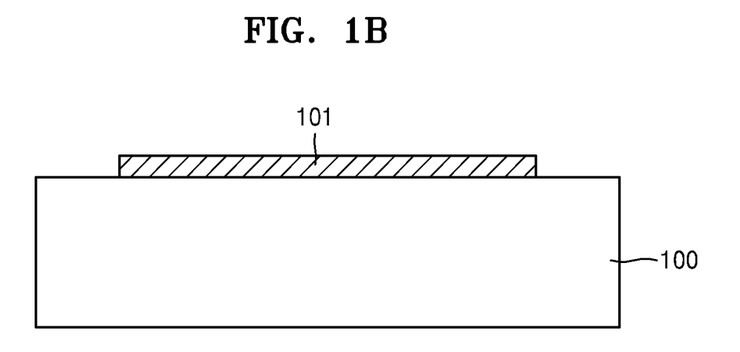

Referring to FIG. 1B, the graphene layer 101 that is formed on the metal substrate 100 may be patterned to have a desired shape. For example, the graphene layer 101 may be etched to have a shape suitable for a device to be fabricated. However, the patterning of the graphene layer 101 is not essential and may be omitted as desired. Alternatively, an order in which the graphene layer 101 is patterned may be changed. For example, a process of FIG. 1F is completed, and then the graphene layer 101 may be patterned.

Figure 1C:
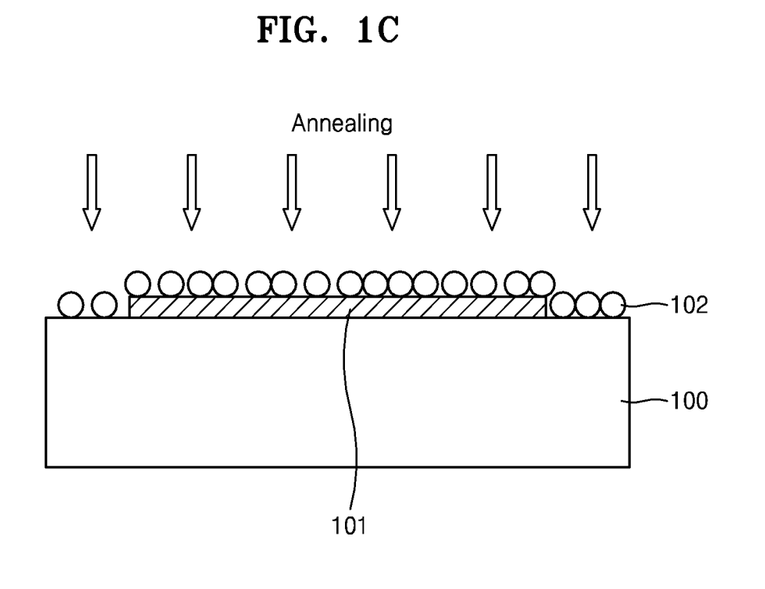

Referring to FIG. 1C, a first material 102 may be uniformly deposited on surfaces of the metal substrate 100 and the graphene layer 101. The first material 102 that is a material for forming an insulating layer may be at least one from among, for example, silicon (Si), aluminum (Al), hafnium (Hf), zirconium (Zr), and lanthanum (La). The first material 102 may be deposited to be about one-atomic layer thick by using CVD or physical vapor deposition (PVD). In this case, in order to prevent or inhibit the first material 102 from being chemically bonded to another element, the first material 102 may be deposited under an ultra-high vacuum (UHV) condition having a pressure that is equal to or lower than $10^{-9}$ torr. After the first material 102 is deposited, the first material 102 may be heated in an UHV environment at a temperature that ranges from about 500° C. to about 550° C.

Figure 1D:
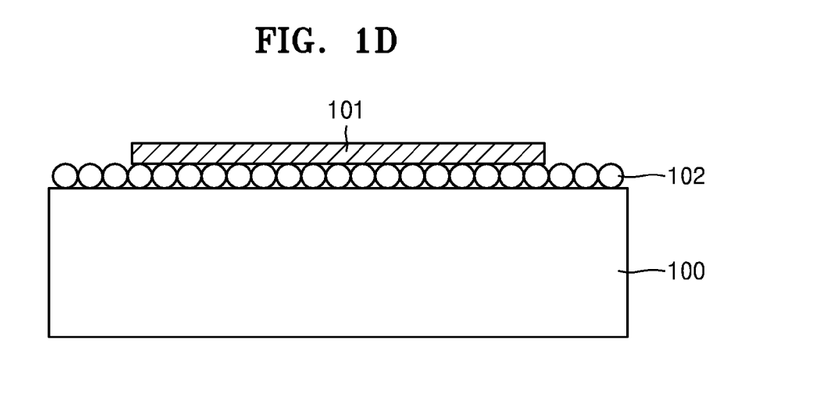

Since a van der Waals force between the metal substrate 100 and the graphene layer 101 ranges from about 30 meV to about 50 meV and thermal energy at room temperature is about 26 meV, when the first material 102 is heated under the above temperature condition, intercalation may be more easily performed. The intercalation may be performed as the first material 102 penetrates between the metal substrate 100 and the graphene layer 101 from edge portions of the graphene layer 101. When a sufficient period of time passes, the first material 102 may penetrate to a central portion of the graphene layer 101. Although a result may vary depending on a width of the graphene layer 101, if the first material 102 is heated for, for example, about 10 minutes, the first material 102 may penetrate to the central portion of the graphene layer 101. Accordingly, as shown in FIG. 1D, the first material 102 may be disposed between the metal substrate 100 and the graphene layer 101.

Figure 1E:
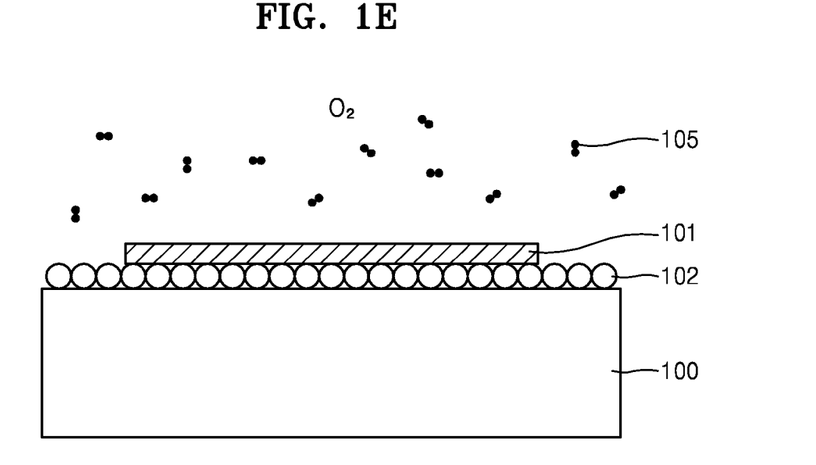
Figure 1F:
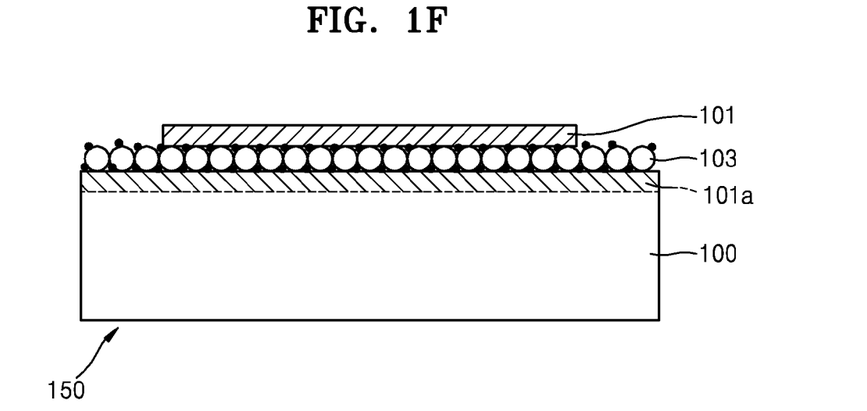

Referring to FIG. 1E, a second material 105 may be deposited over the surface of the graphene layer 101. The second material 105 that is a material for forming an insulating layer by being chemically bonded to the first material 102 may include at least one of, for example, oxygen (O) and nitrogen (N). Although oxygen molecules ($O_2$) that are in a gaseous state are illustrated in FIG. 1E, nitrogen molecules ($N_2$) may be disposed.

The second material 105 may be intercalated between the metal substrate 100 and the graphene layer 101 by heating the second material 105 in an environment in which a temperature is lower than that in FIG. 1C and a pressure is higher than that in FIG. 1C. When heating is performed at a temperature that is higher than that when the first material 102 is intercalated, the intercalated first material 102 may be removed or the graphene layer 101 may be etched. Accordingly, a material of which an intercalation is performed at a higher temperature from among the first material 102 and the second material 105 may be first intercalated and the other material of which an intercalation is performed at a lower temperature may be later intercalated. For example, the second material 105 may be heated for about 10 minutes at a temperature that ranges from about 340° C. to about 400° C. in a vacuum condition that ranges from about $2\times10^{-7}$ torr to about $8\times10^{-7}$ torr.

In general, energy when the first material 102 and the second material 105 are chemically bonded to each other is lower than that when the first material 102 and the second material 105 are not chemically bonded to each other and independently exist between the metal substrate 100 and the graphene layer 101. Accordingly, when the second material 105 is intercalated between the metal substrate 100 and the graphene layer 101, the first material 102 and the second material 105 may be naturally chemically bonded to each other. For example, when it is assumed that the first material 102 is Si, the second material 105 is O, and the metal substrate 100 is Pt having a (111) crystalline orientation, energy when one Si atom and one O atom are bonded to each other between the metal substrate 100 and the graphene layer 101 is lower by about 1.27 eV than that when Si and O molecules independently exist. Also, energy when one Si atom and two O atoms are bonded to each other is lower by about 1.73 eV than that when Si and O molecules independently exist.

Then, referring to FIG. 1F, an insulating layer 103 may be formed between the metal substrate 100 and the graphene layer 101 as the first material 102 and the second material 105 are chemically bonded to each other. For example, when the first material 102 is Si and the second material 105 is O, the insulating layer 103 may be formed of $SiO_2$. Also, when the first material 102 is Si and the second material 105 is N, the insulating layer 103 may be formed of $SiN_x$. That is, the insulating layer 103 may include an oxide insulator or a nitride insulator. A stacked structure 150 that is a metal/insulating layer/graphene stacked structure may be formed.

While the first material 102 is intercalated between the metal substrate 100 and the graphene layer 101, the first material 102 and the surface of the metal substrate 100 may react with each other. As a result, a first material-metal compound layer 101a obtained as the first material 102 and the metal substrate 100 react with each other may be formed on the surface of the metal substrate 100. For example, when the first material 102 is Si, the first material-metal compound layer 101a may be formed of silicide. Also, the insulating layer 103 that is formed by intercalating the second material 105 may be crystalline. That is, the insulating layer 103 may include oxide insulator crystals or nitride insulator crystals. Accordingly, the stacked structure 150 that is a metal/insulating layer/graphene stacked structure formed by using a method of the example embodiments may be different from an existing stacked structure that is formed by using a transfer method in that the stacked structure 150 includes the first material-metal compound layer 101a and the insulating layer 103 is crystalline.

According to example embodiments, after the graphene layer 101 is grown on the metal substrate 100, the graphene layer 101 does not need to be separated from the metal substrate 100. Accordingly, damage to the graphene layer 101 or penetration of impurities, which may occur when the graphene layer 101 is separated from the metal substrate 100 and is transferred to a surface of another material, may be prevented or inhibited. Accordingly, when a semiconductor device or a display apparatus is fabricated by using the graphene layer 101, a fabrication process may be simplified and fabrication yield may be increased. Also, since electrical properties of the graphene layer 101 may be maintained, the performance of the semiconductor device or the display apparatus that is finally fabricated may be improved.

Figure 2A:
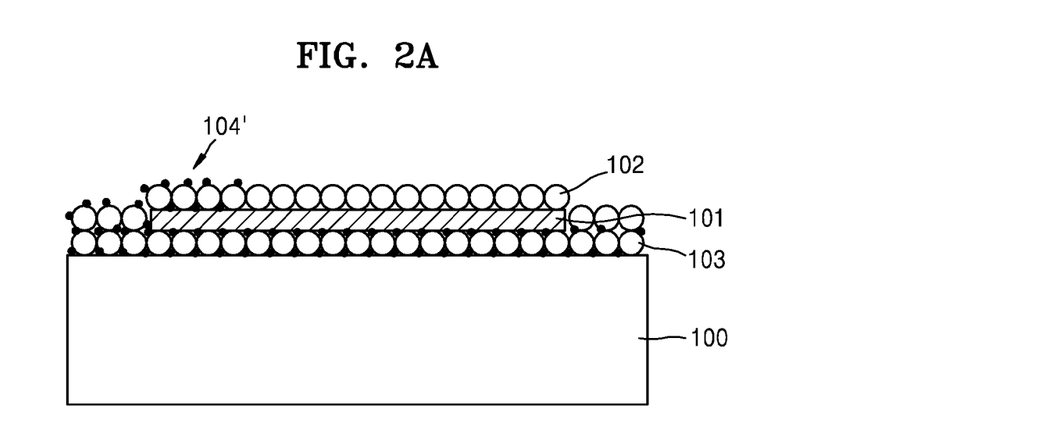
FIGS. 2A and 2B are cross-sectional views for explaining a process of additionally forming an insulating layer on the graphene layer after the insulating layer is intercalated between the metal substrate and the graphene layer.
Figure 2B:
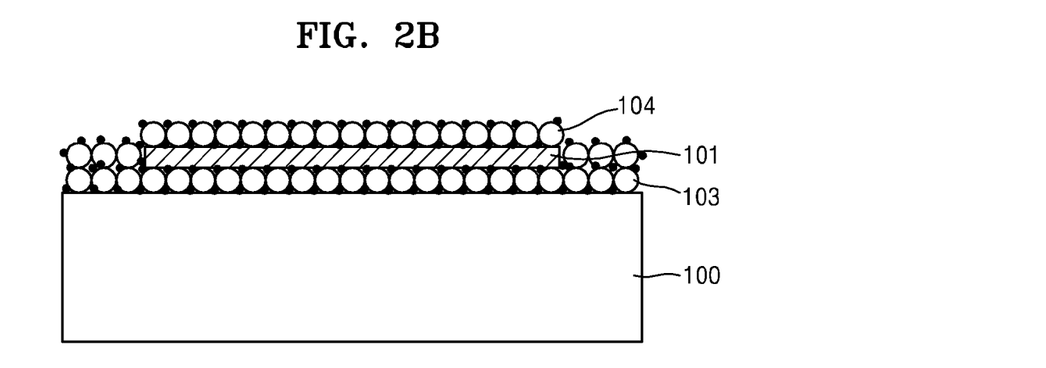

FIGS. 2A and 2B are cross-sectional views for explaining a process of additionally forming an insulating layer 104 on the graphene layer 101 after the insulating layer 103 is intercalated between the metal substrate 100 and the graphene layer 101.

Referring to FIG. 2A, after the insulating layer 103 is formed by chemically bonding the first material 102 to the second material 105, part of the first material 102 that is not intercalated between the metal substrate 100 and the graphene layer 101 may partially remain on the graphene layer 101. The part of the first material 102 that partially remains on the graphene layer 101 may be chemically bonded to the second material 105 while the second material 105 is intercalated. Accordingly, when the insulating layer 103 is formed between the metal substrate 100 and the graphene layer 101, an additional insulating layer 104' may be partially formed on the surface of the graphene layer 101. Although the additional insulating layer 104' that is partially formed on the surface of the graphene layer 101 may be removed, the insulating layer 104' may be used as a protective layer for protecting the graphene layer 101.

To this end, the first material 102 may be further deposited on a portion of the surface of the graphene layer 101, on which the additional insulating layer 104' is not formed, by using CVD or PVD. Without intercalation, the first material 102 on the graphene layer 101 may be chemically bonded to the second material 105. That is, a process of heating under an UHV condition of FIGS. 1C and 1E may be omitted, and the first material 102 on the graphene layer 101 may be exposed to an atmosphere of the second material 105. Accordingly, as shown in FIG. 2B, the insulating layer 104 may be further formed on the graphene layer 101. The insulating layer 104 that is formed on the graphene layer 101 may prevent or inhibit the graphene layer 101 from being contaminated and damaged when the metal substrate 100 is dissolved and removed in a solvent and an insulating layer/graphene/insulating layer structure is formed.

Figure 3A:
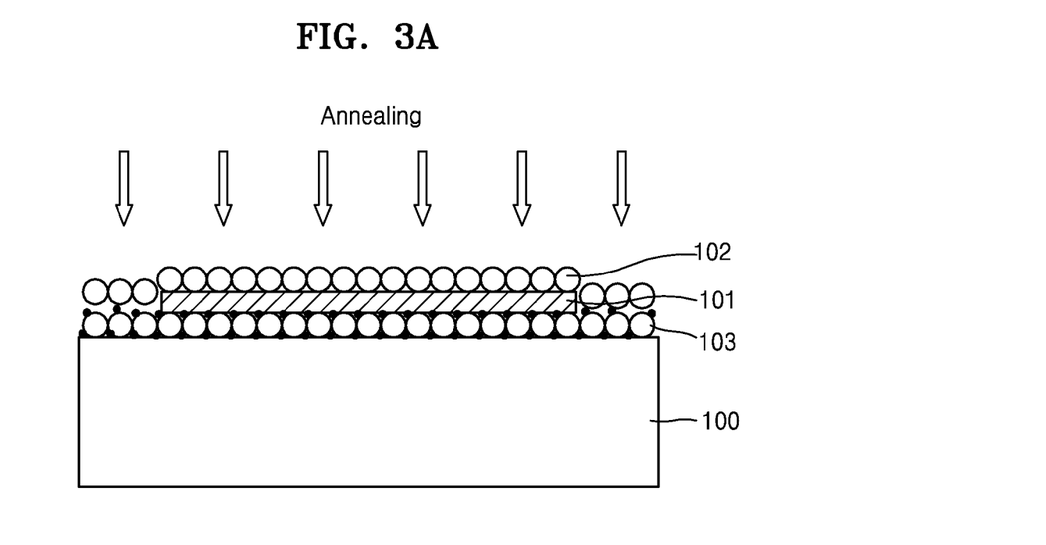
FIGS. 3A through 3C are cross-sectional views for explaining a process of additionally intercalating the insulating layer between the metal substrate and the graphene layer, according to example embodiments.
Figure 3B:
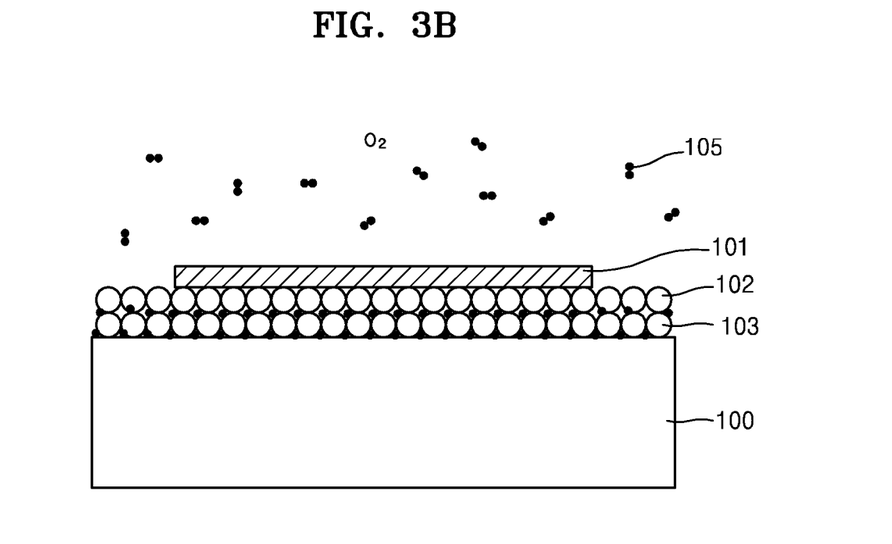
Figure 3C:
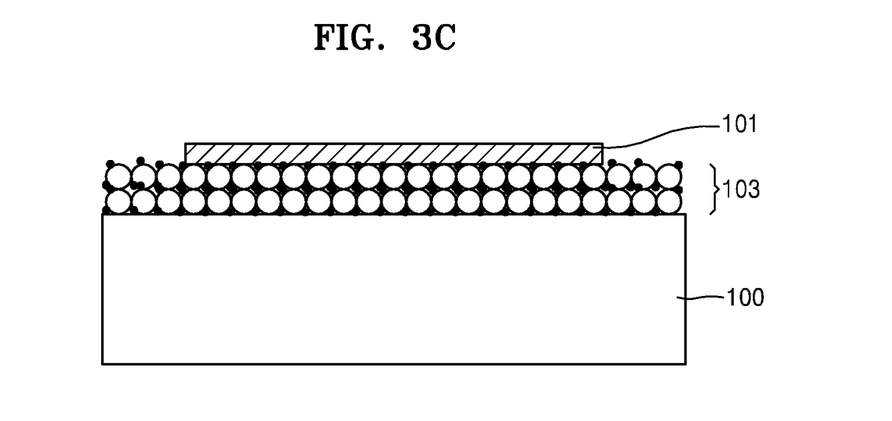

FIGS. 3A through 3C are cross-sectional views for explaining a process of additionally intercalating the insulating layer 103 between the metal substrate 100 and the graphene layer 101, according to example embodiments. The insulating layer 103 that is formed by using the process of FIGS. 1A through 1F may be one-atomic layer thick (for example, several Å). In order to further increase a thickness of the insulating layer 103, the intercalation method of FIGS. 1E through 1F may be repeatedly performed.

For example, after the process of FIG. 1F is completed, as shown in FIG. 3A, the first material 102 may be further disposed on surfaces of the insulating layer 103 and the graphene layer 101 by using PVD or CVD. As described above, the first material 102 may be at least one from among, for example, Si, Al, Hf, Zr, and La. The first material 102 may be deposited to be about one-atomic layer thick. When the first material 102 is heated at a temperature that ranges from about 500° C. to about 550° C. in an UHV environment having a pressure that is equal to or lower than $10^{-9}$ torr, the first material 102 may be intercalated between the insulating layer 103 and the graphene layer 101.

As shown in FIG. 3B, the second material 105 may be disposed over the graphene layer 101, and may be heated at a temperature that ranges from about 340° C. to about 400° C. under a vacuum condition that ranges from about $2\times10^{-7}$ torr to about $8\times10^{-7}$ torr. As described above, the second material 105 may include at least one of O and N.

Accordingly, as the second material 105 is intercalated between the insulating layer 103 and the graphene layer 101, the first material 102 and the second material 105 are chemically bonded to each other. As a result, as shown in FIG. 3C, the insulating layer 103 may be additionally formed between the metal substrate 100 and the graphene layer 101. The insulating layer 103 may be about two-atomic layer thick. When the process of FIGS. 3A through 3C is sequentially and repeatedly performed, a thickness of the insulating layer 103 that is formed between the metal substrate 100 and the graphene layer 101 may be continuously increased.

Figure 4A:
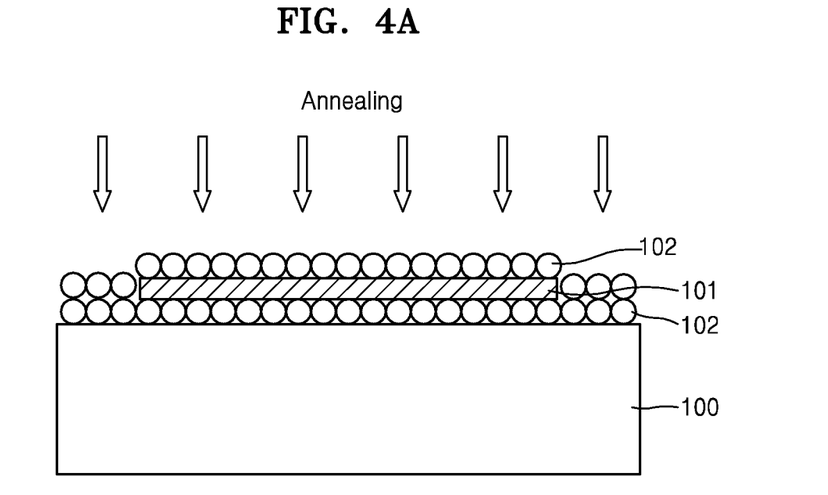
FIGS. 4A through 4C are cross-sectional views for explaining a process of intercalating the insulating layer between the metal substrate and the graphene layer, according to example embodiments.
Figure 4B:
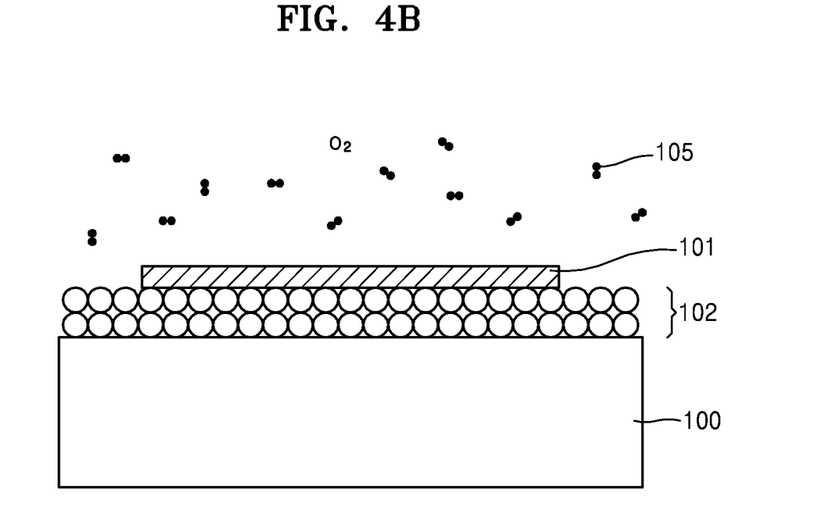
Figure 4C:
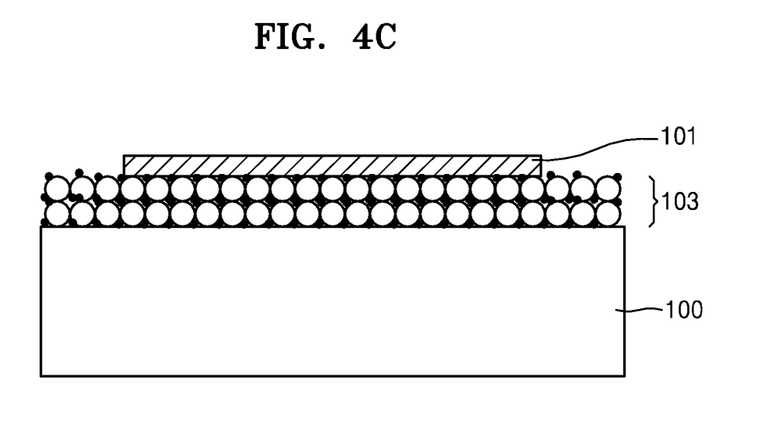

FIGS. 4A through 4C are cross-sectional views for explaining a process of intercalating the insulating layer 103 between the metal substrate 100 and the graphene layer 101, according to example embodiments. In FIGS. 3A through 3C, in order to increase a thickness of the insulating layer 103, a process of intercalating the first material 102 and a process of intercalating the second material 105 are alternately performed one-by-one. However, the insulating layer 103 having an increased thickness may be formed by intercalating the first material 102 at least twice and then intercalating the second material 105 at least twice.

As shown in FIG. 4A, the first material 102 is deposited on the surface of the graphene layer 101 to be about one-atomic layer thick by using PVD or CVD. The first material 102 is intercalated between the metal substrate 100 and the graphene layer 101 by heating the first material 102 at a temperature that ranges from about 500° C. to about 550° C. in an UHV environment having a pressure that is equal to or lower than $10^{-9}$ torr. The first material 102 is deposited again on the surface of the graphene layer 101 to be about one-atomic layer thick by using PVD or CVD, and the first material 102 deposited on the graphene layer 101 is heated at a temperature that ranges from about 500° C. to about 550° C. in an UHV environment having a pressure that is equal to or lower than $10^{-9}$ torr. Accordingly, the first material 102 deposited on the graphene layer 101 may be additionally intercalated between the metal substrate 100 and the graphene layer 101. As a result, the first material 102 may be arranged as two atomic layers between the metal substrate 100 and the graphene layer 101.

Referring to FIG. 4B, the second material 105 may be deposited over the graphene layer 101, and the second material 105 may be heated at a temperature that ranges from about 340° C. to about 400° C. under a vacuum condition that ranges from about $2 \times 10^{-7}$ torr to about $8 \times 10^{-7}$ torr. Accordingly, as the second material 105 may be intercalated between the insulating layer 103 and the graphene layer 101, the first material 102 and the second material 105 may be chemically bonded to each other. Two processes of intercalating the second material 105 may be performed as one continuous process. For example, the second material 105 may be heated for about 10 minutes in FIG. 3B, whereas the second material 105 may be heated for about 20 minutes in FIG. 4B.

As a result, as shown in FIG. 4C, the insulating layer 103 that is about two-atomic layer thick may be formed between the metal substrate 100 and the graphene layer 101. Although each of the first material 102 and the second material 105 is intercalated twice in FIGS. 4A through 4C, example embodiments are not limited thereto. For example, an insulating layer 103 that is about three-atomic layer thick may be formed by intercalating the first material 102 three times and then intercalating the second material 105 three times.

Figure 5A:
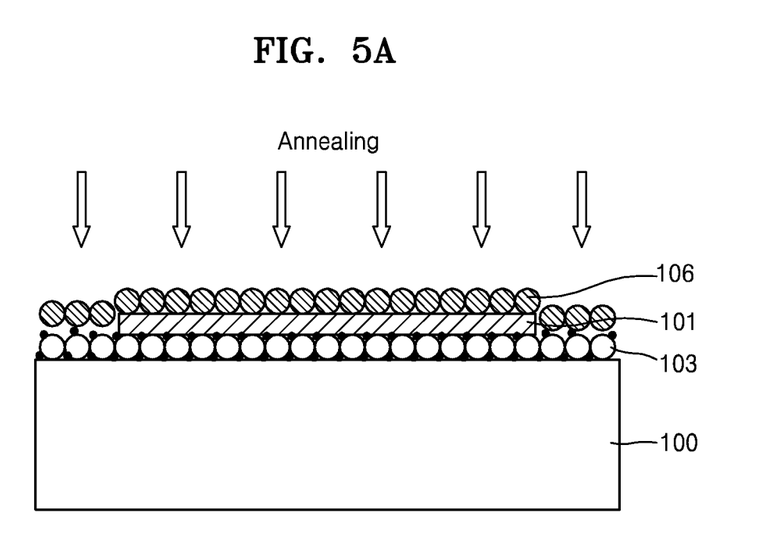
FIGS. 5A through 5C are cross-sectional views for explaining a process of further intercalating an additional insulating layer between the metal substrate and the graphene layer, according to example embodiments.
Figure 5B:
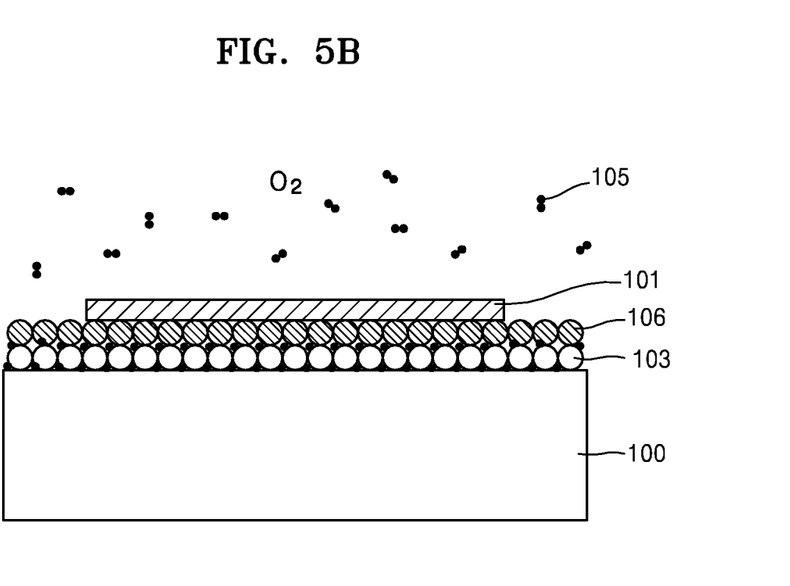
Figure 5C:
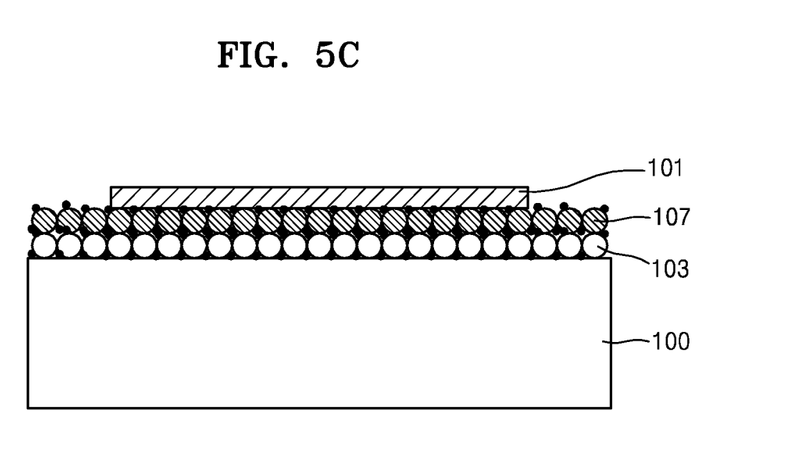

FIGS. 5A through 5C are cross-sectional views for explaining a process of further intercalating an additional insulating layer 107 between the metal substrate 100 and the graphene layer 101, according to example embodiments. Although the insulating layer 103 having a single composition is formed between the metal substrate 100 and the graphene layer 101 in the above example embodiments, a plurality of insulating layers, for example, the insulating layer 103 and the additional insulating layer 107, having different components or compositions may be formed as shown in FIGS. 5A through 5C.

For example, after the process of FIG. 1F is completed, a third material 106 may be further deposited on the surfaces of the insulating layer 103 and the graphene layer 101, as shown in FIG. 5A. The third material 106 may be at least one from among, for example, Si, Al, Hf, Zr, and La, and may be different from the first material 102. For example, Si may be selected as the first material 102 and Al may be selected as the third material 106. The third material 106 may be deposited to be about one-atomic layer thick by using CVD or PVD. When the third material 106 is heated at a temperature that ranges from about 500° C. to about 550° C. in an UHV environment having a pressure that is equal to or lower than $10^{-9}$ torr, the third material 106 may be intercalated between the insulating layer 103 and the graphene layer 101. However, a heating temperature of the third material 106 may be lower than a heating temperature of the first material 102 within the above temperature range.

As shown in FIG. 5B, the second material 105 may be deposited over the graphene layer 101, and may be heated at a temperature that ranges from about 340° C. to about 400° C. in a vacuum state that ranges from about $2 \times 10^{-7}$ torr to about $8 \times 10^{-7}$ torr. As described above, the second material 105 may include at least one of O and N.

Accordingly, as the second material 105 may be intercalated between the insulating layer 103 and the graphene layer 101, the third material 106 and the second material 105 may be chemically bonded to each other. As a result, as shown in FIG. 5C, the additional insulating layer 107, formed of the third material 106, may be formed between the graphene layer 101 and the insulating layer 103 formed of the first material 102. The additional insulating layer 107 may be about one-atomic layer thick. For example, when Si is selected as the first material 102 and Al is selected as the third material 106, the insulating layer 103 that is a lower insulating layer may be formed of $SiO_2$ and the additional insulating layer 107 that is an upper insulating layer may be formed of $Al_2O_3$. Also, O may be selected as the second material 105 in FIG. 1E, whereas N may be selected as the second material 105 in FIG. 5B. In this case, when the first material 102 is Si and the third material 106 is Al, the insulating layer 103 that is a lower insulating layer may be formed of $SiO_2$ and the additional insulating layer 107 that is an upper insulating layer may be formed of AlN. When the process of FIGS. 5A through 5C is sequentially repeatedly performed, two different insulating layers, that is, the insulating layer 103 and the additional insulating layer 107, may be alternately formed between the metal substrate 100 and the graphene layer 101.

Figure 6A:
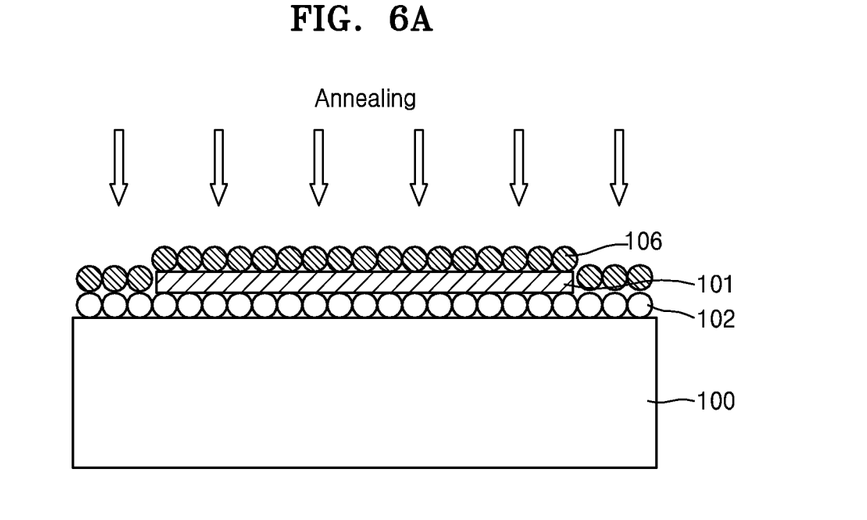
FIGS. 6A through 6C are cross-sectional views for explaining a process of further intercalating the additional insulating layer between the metal substrate and the graphene layer, according to example embodiments.
Figure 6B:
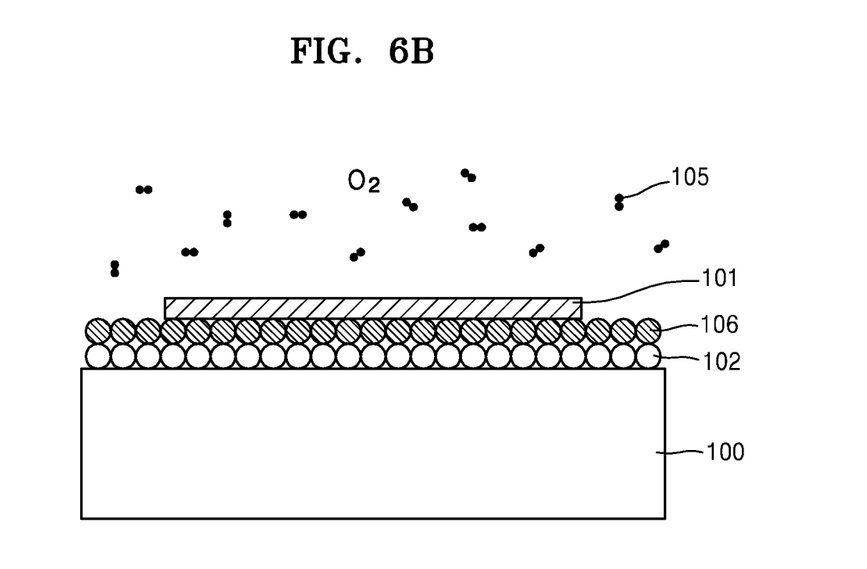
Figure 6C:
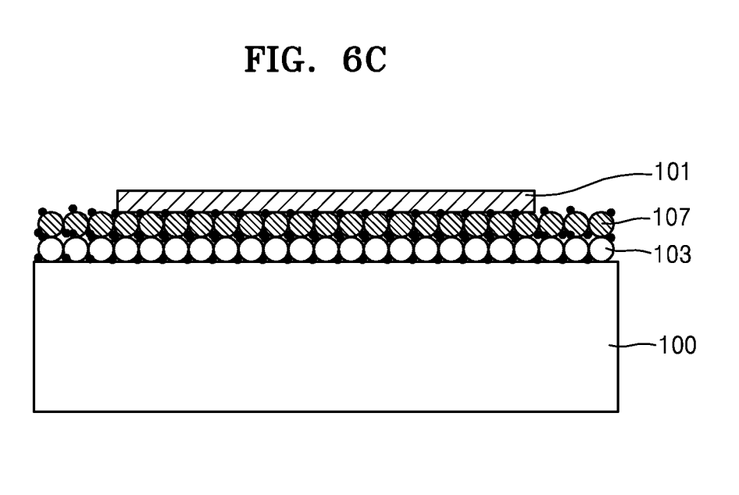

FIGS. 6A through 6C are cross-sectional views for explaining a process of further intercalating the additional insulating layer 107 between the metal substrate 100 and the graphene layer 101, according to example embodiments. The insulating layer 103 that is a lower insulating layer is completely formed and then the additional insulating layer 107 that is an upper insulating layer is formed as described with reference to FIGS. 5A through 5C. However, two insulating layers, that is, the insulating layer 103 and the additional insulating layer 107, may be formed at one time by sequentially intercalating the first material 102 and the third material 106 and then intercalating the second material 105.

For example, as shown in FIG. 6A, the first material 102 is deposited on the surface of the graphene layer 101 to be about one-atomic layer thick by using PVD or CVD. The first material 102 is intercalated between the metal substrate 100 and the graphene layer 101 by heating the first material 102 at a temperature that ranges from about 500° C. to about 550° C. in an UHV environment having a pressure that is equal to or lower than $10^{-9}$ torr. The third material 106 may be deposited again on the surface of the graphene layer 101 to be about one-atomic layer thick by using PVD or CVD, and may be heated at a temperature that ranges from about 500° C. to about 550° C. in an UHV environment having a pressure that is equal to or lower than $10^{-9}$ torr. However, a heating temperature of the third material 106 may be lower than a heating temperature of the first material 102 within the temperature range. Accordingly, the third material 106 may be further intercalated between the first material 102 and the graphene layer 101.

Referring to FIG. 6B, the second material 105 may be deposited over the graphene layer 101, and may be heated at a temperature that ranges from about 340° C. to about 400° C. under a vacuum condition that ranges from about $2\times10^{-7}$ torr to about $8\times10^{-7}$ torr. Accordingly, the second material 105 may be further intercalated between the metal substrate 100 and the graphene layer 101. In this case, the second material 105 may be chemically bonded to each of the first material 102 and the third material 106. The second material 105 may be heated for a sufficient period of time so that the second material 105 is completely bonded to the first material 102 and the third material 106. For example, the second material 105 may be heated for about 10 minutes in FIG. 1E, whereas the second material 105 may be heated for about 20 minutes in FIG. 6B.

As a result, as shown in FIG. 6C, the insulating layer 103, in which the second material 105 and the first material 102 are chemically bonded to each other, and the additional insulating layer 107, in which the second material 105 and the third material 106 are chemically bonded to each other, may be simultaneously formed between the metal substrate 100 and the graphene layer 101. Each of the insulating layer 103 and the additional insulating layer 107 may be about one-atomic layer thick. However, example embodiments are not limited thereto. For example, in FIG. 6A, thicknesses of the insulating layer 103 and the additional insulating layer 107 may be increased by intercalating each of the first material 102 and the third material 106 at least twice.

As described above, since the insulating layer 103 and the additional insulating layer 107 may be intercalated between the metal substrate 100 and the graphene layer 101 by using a method of example embodiments, a process of transferring the graphene layer 101 in order to fabricate a device may be omitted. That is, right after the method of example embodiments is performed, the device may be fabricated without transferring the graphene layer 101. For example, FIG. 7 is a cross-sectional view illustrating a structure of a transistor 200 that is fabricated by using the stacked structure 150 that is formed by using the method of FIGS. 1A through 1F.

Figure 7:
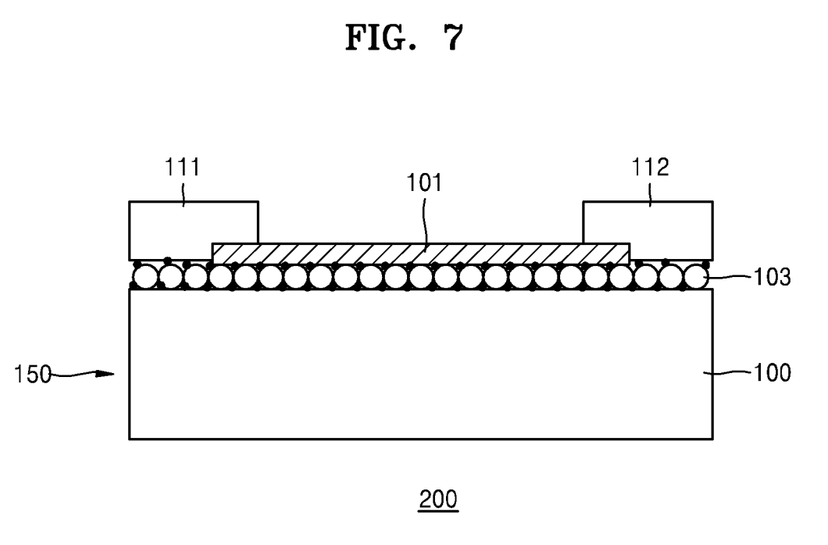
FIG. 7 is a cross-sectional view illustrating a structure of a transistor that is fabricated by using a stacked structure that is formed by using a method of FIGS. 1A through 1F.

Referring to FIG. 7, the transistor 200 may include the stacked structure 150 of FIG. 1F, and a first electrode 111 and a second electrode 112 that are disposed on both sides of the graphene layer 101 of the stacked structure 150. The metal substrate 100 may function as a gate electrode, the insulating layer 103 that is intercalated between the metal substrate 100 and the graphene layer 101 may function as a gate insulating film, and the graphene layer 101 may function as a channel. The first electrode 111 and the second electrode 112 may be respectively a source electrode and a gate electrode. Accordingly, according to example embodiments, the transistor 200 that uses the graphene layer 101 as a channel may be fabricated by using a relatively simple process.

While the inventive concepts have been particularly shown and described with reference to example embodiments thereof by using specific terms, the example embodiments and terms have merely been used to explain the inventive concepts and should not be construed as limiting the scope of the inventive concepts as defined by the claims.

Example embodiments should be considered in a descriptive sense only and not for purposes of limitation. Therefore, the scope of the inventive concepts is defined not by the detailed description but by the appended claims, and all differences within the scope will be construed as being included in the inventive concepts.

What is claimed is:

1. A method comprising:
   growing a graphene layer on a metal layer;
   depositing a first material on a surface of the graphene layer;
   intercalating the first material between the graphene layer and the metal layer by heating the first material at a first pressure and a first temperature;
   depositing a second material over the surface of the graphene layer; and
   intercalating the second material between the graphene layer and the metal layer by heating the second material at a second pressure different from the first pressure and a second temperature different from the first temperature to form a first insulating layer between the metal layer and the graphene layer, the first material and the second material being chemically bonded to each other,
   wherein the first pressure is lower than the second pressure, and the first temperature is higher than the second temperature.

2. The method of claim 1, wherein the depositing a first material deposits the first material including at least one of silicon (Si), aluminum (Al), hafnium (Hf), zirconium (Zr), and lanthanum (La).

3. The method of claim 1, wherein
   the depositing a second material deposits the second material including at least one of oxygen (O) and nitrogen (N), and
   the intercalating the second material forms the first insulating layer including one of an oxide insulator and a nitride insulator.

4. The method of claim 3, wherein the intercalating the second material forms the first insulating layer including one of oxide insulator crystals and nitride insulator crystals.

5. The method of claim 1, wherein
   the first pressure is equal to or lower than $10^{-9}$ torr and the first temperature ranges from about 500° C. to about 550° C., and
   the second pressure ranges from $2\times10^{-7}$ torr to $8\times10^{-7}$ torr and the second temperature ranges from about 340° C. to about 400° C.

6. The method of claim 1, wherein the intercalating the first material and the intercalating the second material are sequentially and repeatedly performed.

7. The method of claim 1, wherein the intercalating the second material is continuously and repeatedly performed at least twice after the intercalating the first material is continuously and repeatedly performed at least twice.

8. The method of claim 1, wherein after the intercalating the first material, the method further comprising:
   depositing a third material on the surface of the graphene layer, the third material being different from the first material and the second material;
   intercalating the third material between the graphene layer and the metal layer by heating the third material at the first pressure and the first temperature after the intercalating the first material prior to the intercalating the second material; and
   forming a second insulating layer between the metal layer and the graphene layer after the intercalating the second material, the third material and the second material being chemically bonded to each other.

9. The method of claim 8, wherein the depositing a third material deposits the third material including at least one of Si, Al, Hf, Zr, and La.

10. The method of claim 1, after the intercalating the second material, the method further comprising:
depositing a third material, on the surface of the graphene layer, the third material being different from the first material and the second material; and
intercalating the third material between the graphene layer and the metal layer by heating the third material at the first pressure and the first temperature to form a second insulating layer between the metal layer and the graphene layer, the third material and the second material being chemically bonded to each other.

11. The method of claim 1, further comprising:
patterning the graphene layer after the growing.

12. The method of claim 1, wherein the metal layer includes at least one of copper (Cu), nickel (Ni), platinum (Pt), cobalt (Co), ruthenium (Ru), aluminum (Al), iron (Fe), gold (Au), magnesium (Mg), chromium (Cr), manganese (Mn), rhodium (Rh), tantalum (Ta), titanium (Ti), iridium (Ir), uranium (U), vanadium (V), and tungsten (W).

13. A method of fabricating a transistor, the method comprising:
growing a graphene layer on a metal layer;
patterning the graphene layer;
depositing a first material on a surface of the graphene layer;
intercalating the first material between the graphene layer and the metal layer by heating the first material at a first pressure and a first temperature;
depositing a second material over the surface of the graphene layer;
intercalating the second material between the graphene layer and the metal layer by heating the second material at a second pressure different from the first pressure and a second temperature different from the first temperature to form an insulating layer between the metal layer and the graphene layer, the first material and the second material being chemically bonded to each other; and
forming a first electrode contacting one side of the graphene layer and a second electrode contacting another side of the graphene layer,
wherein the first pressure is lower than the second pressure, and the first temperature is higher than the second temperature.

14. The method of claim 13, wherein the depositing a first material deposits the first material including at least one of silicon (Si), aluminum (Al), hafnium (Hf), zirconium (Zr), and lanthanum (La).

15. The method of claim 13, wherein
the depositing a second material deposits the second material including at least one of oxygen (O) and nitrogen (N), and
the intercalating the second material forms the insulating layer including one of an oxide insulator and a nitride insulator.

16. The method of claim 13, wherein
the first pressure is equal to or lower than $10^{-9}$ torr and the first temperature ranges from about 500° C. to about 550° C., and
the second pressure ranges from $2\times10^{-7}$ torr to $8\times10^{-7}$ torr and the second temperature ranges from about 340° C. to about 400° C.

* * * * *